US011659719B2

(12) United States Patent
Lee et al.

(10) Patent No.: US 11,659,719 B2
(45) Date of Patent: May 23, 2023

(54) SEMICONDUCTOR DEVICE

(71) Applicant: Samsung Electronics Co., Ltd., Suwon-si (KR)

(72) Inventors: Kilho Lee, Busan (KR); Gwanhyeob Koh, Seoul (KR)

(73) Assignee: SAMSUNG ELECTRONICS CO., LTD., Gyeonggi-do (KR)

( * ) Notice: Subject to any disclaimer, the term of this patent is extended or adjusted under 35 U.S.C. 154(b) by 22 days.

(21) Appl. No.: 17/381,768

(22) Filed: Jul. 21, 2021

(65) Prior Publication Data

US 2021/0351233 A1 Nov. 11, 2021

Related U.S. Application Data

(63) Continuation of application No. 16/848,010, filed on Apr. 14, 2020, now Pat. No. 11,121,175.

(30) Foreign Application Priority Data

Oct. 2, 2019 (KR) .......................... 10-2019-0122468

(51) Int. Cl.
*H01L 27/00* (2006.01)
*H01L 27/22* (2006.01)
(Continued)

(52) U.S. Cl.
CPC ............ *H01L 27/228* (2013.01); *G11C 11/02* (2013.01); *G11C 11/5614* (2013.01)

(58) Field of Classification Search
CPC ......... H01L 27/22; H01L 43/02; H01L 43/08; H01L 43/10; H01L 43/12; H01L 27/105; H01L 29/82; H01L 21/768; H01L 43/04; H01L 43/06; H01L 43/14; H01L 23/522; H01L 23/528; H01L 21/8239; H01L 21/8246; H01L 21/3213; H01L 21/66; H01L 23/532; H01L 27/115; H01L 27/24; H01L 29/66; H01L 43/00; H01L 45/00; H01L 23/48; H01L 23/52; H01L 27/11551; H01L 29/04; G11C 11/16; G11C 11/14;
(Continued)

(56) References Cited

U.S. PATENT DOCUMENTS 9,679,943 B2 6/2017 Park et al.
9,865,649 B2 1/2018 Tan et al.
(Continued)

*Primary Examiner* — Thong Q Le
(74) *Attorney, Agent, or Firm* — Harness, Dickey & Pierce, P.L.C.

(57) ABSTRACT

A semiconductor device including a substrate that has a first region and a second region, a plurality of lower conductive patterns on the substrate, the plurality of lower conductive patterns including a first conductive pattern in the first region of the substrate and a second conductive pattern in the second region of the substrate, a magnetic tunnel junction on the first conductive pattern, a contact between the magnetic tunnel junction and the first conductive pattern, a through electrode on the second conductive pattern, and a plurality of upper conductive patterns on the magnetic tunnel junction and the through electrode. The contact includes a first contact on the lower conductive patterns, a second contact on the first contact, and a first barrier layer that covers a bottom surface and a lateral surface of the second contact.

20 Claims, 15 Drawing Sheets

(51) Int. Cl.
*G11C 11/02* (2006.01)
*G11C 11/56* (2006.01)

(58) Field of Classification Search
CPC ......... G11C 11/02; G11C 11/56; G11C 11/15;
G11C 11/18; G11C 11/00; G11C 13/00;
G11C 5/12; G11C 19/08; G11C 5/06;
G11C 5/08; G11C 7/24
USPC ........................... 365/158, 171, 157, 173, 66
See application file for complete search history.

(56) References Cited

U.S. PATENT DOCUMENTS

| | | |
|---|---|---|
| 10,121,964 B2 | 11/2018 | Tan et al. |
| 2015/0011022 A1* | 1/2015 | Lee .................... G03F 7/70633 |
| | | 438/14 |
| 2018/0182810 A1 | 6/2018 | Yi et al. |
| 2020/0028072 A1 | 1/2020 | Chuang et al. |

* cited by examiner

SEMICONDUCTOR DEVICE

CROSS-REFERENCE TO RELATED APPLICATION

This is a continuation of U.S. application Ser. No. 16/848,010, filed Apr. 14, 2020, which claims priority to Korean Application No. 10-2019-0122468, filed on Oct. 2, 2019, the disclosures of each of which are hereby incorporated by reference in their entirety.

BACKGROUND

The present inventive concepts relates to semiconductor devices, and more particularly, to semiconductor devices including magnetic memory elements.

It has been proposed an embedded semiconductor device with a memory element and a logic element integrated together on one chip. The embedded semiconductor device may include a main memory element configured to store user data and a functional circuit configured to process specific functions demanded by a user.

The main memory element may have non-volatile characteristics to maintain user data when no power is supplied. A flash memory device may be the main memory element of a conventional embedded semiconductor device because flash memory devices may achieve non-volatile characteristics of data. However, as is well known, because flash memory devices have a slow operating speed, the conventional embedded semiconductor device would have a limitation in meeting a demand for a fast operating speed. In order to meet these requirements, magnetic memory devices have been developed as memory devices. Since the magnetic memory device operates at high speed and has non-volatile characteristics, it has attracted considerable attention as a next-generation memory device.

With the remarkable advance in electronic industry, there is an increasing demand for high integration and/or low power consumption of magnetic memory devices. Accordingly, many studies have been conducted to meet these demands.

SUMMARY

Some example embodiments of the present inventive concepts provide a semiconductor device with improved electrical characteristics and a method of fabricating the same.

Some example embodiments of the present inventive concepts provide a semiconductor fabrication method in which defects are reduced and a semiconductor device manufactured by the same.

An object of the present inventive concepts is not limited to the mentioned above, and other objects which have not been mentioned above will be clearly understood to those skilled in the art from the following description.

According to some example embodiments of the present inventive concepts, a semiconductor device may include a substrate having a first region and a second region; a plurality of lower conductive patterns on the substrate, the plurality of lower conductive patterns including a first conductive pattern in the first region of the substrate and a second conductive pattern in the second region of the substrate; a magnetic tunnel junction on the first conductive pattern; a contact between the magnetic tunnel junction and the first conductive pattern, the contact includes a first contact on the first conductive pattern, a second contact on the first contact, and a first barrier layer that covers a bottom surface and a lateral surface of the second contact; a through electrode on the second conductive patterns on the second region of the substrate; and a plurality of upper conductive patterns on the magnetic tunnel junction and the through electrode.

According to some example embodiments of the present inventive concepts, a semiconductor device may include a substrate including peripheral circuits; a lower conductive pattern on the substrate; an upper conductive pattern on the lower conductive pattern; a through electrode that connects the lower conductive pattern to the upper conductive pattern; and a bottom contact, a top contact, and a magnetic tunnel junction that are spaced apart from the through electrode and are connected in series between and from the lower conductive pattern toward the upper conductive pattern. A width of the top contact may be less than a width of the magnetic tunnel junction. A width of the bottom contact may be greater than the width of the top contact.

According to some example embodiments of the present inventive concepts, a semiconductor device may include a transistor on a substrate; an interlayer insulation layer on the substrate, the interlayer insulation layer covering the transistor; a lower conductive pattern on the interlayer insulation layer, the lower conductive pattern being connected to the transistor; a first insulation layer on the lower conductive pattern; a second insulation layer on the first insulation layer; a magnetic tunnel structure that includes a first contact, a second contact, and a magnetic tunnel junction that are connected in series and define a contact hole that penetrates the first and second insulation layers, an interface between the first insulation layer and the second insulation layer is at the same level as a level of an interface between the first contact and the second contact; a through electrode that defines a via hole that penetrates the first and second insulation layers, the via hole being spaced apart from the contact hole; and an upper conductive pattern on the second insulation layer, the upper conductive pattern being connected to the magnetic tunnel structure and the through electrode.

DETAILED DESCRIPTION OF EMBODIMENTS

The following will now describe a semiconductor device according to the present inventive concepts with reference to accompanying drawings.

Figure 1:
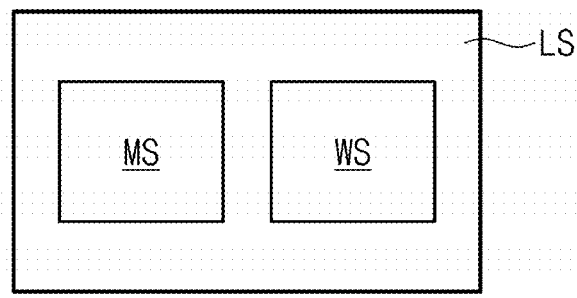
FIG. 1 illustrates a simplified block diagram showing a semiconductor device according to some example embodiments of the present inventive concepts.

FIG. 1 illustrates a simplified block diagram showing a semiconductor device according to some example embodiments of the present inventive concepts.

Referring to FIG. 1, a semiconductor device may include a logic structure LS formed on a substrate and also include a memory structure MS and a wiring structure WS that are provided on the substrate.

The memory structure MS may include at least one memory cell. For example, the memory structure MS may include one memory cell that extends in a direction perpendicular to the substrate. For another example, the memory structure MS may include three-dimensionally arranged memory cells, a plurality of word lines electrically connected to the memory cells, a plurality of bit lines electrically connected to the memory cells, and a plurality of source lines electrically connected to the memory cells. In this description, the phrase "electrically connected/coupled to" may include "directly or indirectly electrically connected/coupled to." The memory cell may include a memory element. The memory element may be a variable resistance device that is switched from one to the other of its two resistance states by an applied electrical pulse.

The logic structure LS may include a selection element. The selection element may be configured to selectively control flow of charges passing through the memory element. For example, the selection element may consist of a PMOS or NMOS field effect transistor.

The logic structure LS may further include logic circuits for performing certain logic operations and/or peripheral circuits for driving the memory cells. For example, the logic circuits may include logic cells for performing one Boolean logic function or one storage function. The peripheral circuits may include a row decoder, a column selection circuit, read/write circuit, and/or a control logic for driving (e.g., read or write operation) the memory cell.

The logic structure LS may include a plurality of CMOS transistors that constitute the logic circuits or the memory peripheral circuits, and also include horizontal connection patterns connected to the CMOS transistors.

The wiring structure WS may include a vertical connection structure for electrical connection of the logic structure LS. For example, the vertical connection structure may be electrically connected to the logic circuits of the logic structure LS, and may include one or more of a conductive via and a connection pattern that extend in a direction perpendicular to the substrate. Alternatively, the wiring structures WS may be electrically connected to the memory peripheral circuits of the logic structure LS, and may be electrically connected through the memory peripheral circuits to the memory structure MS.

Figure 2:
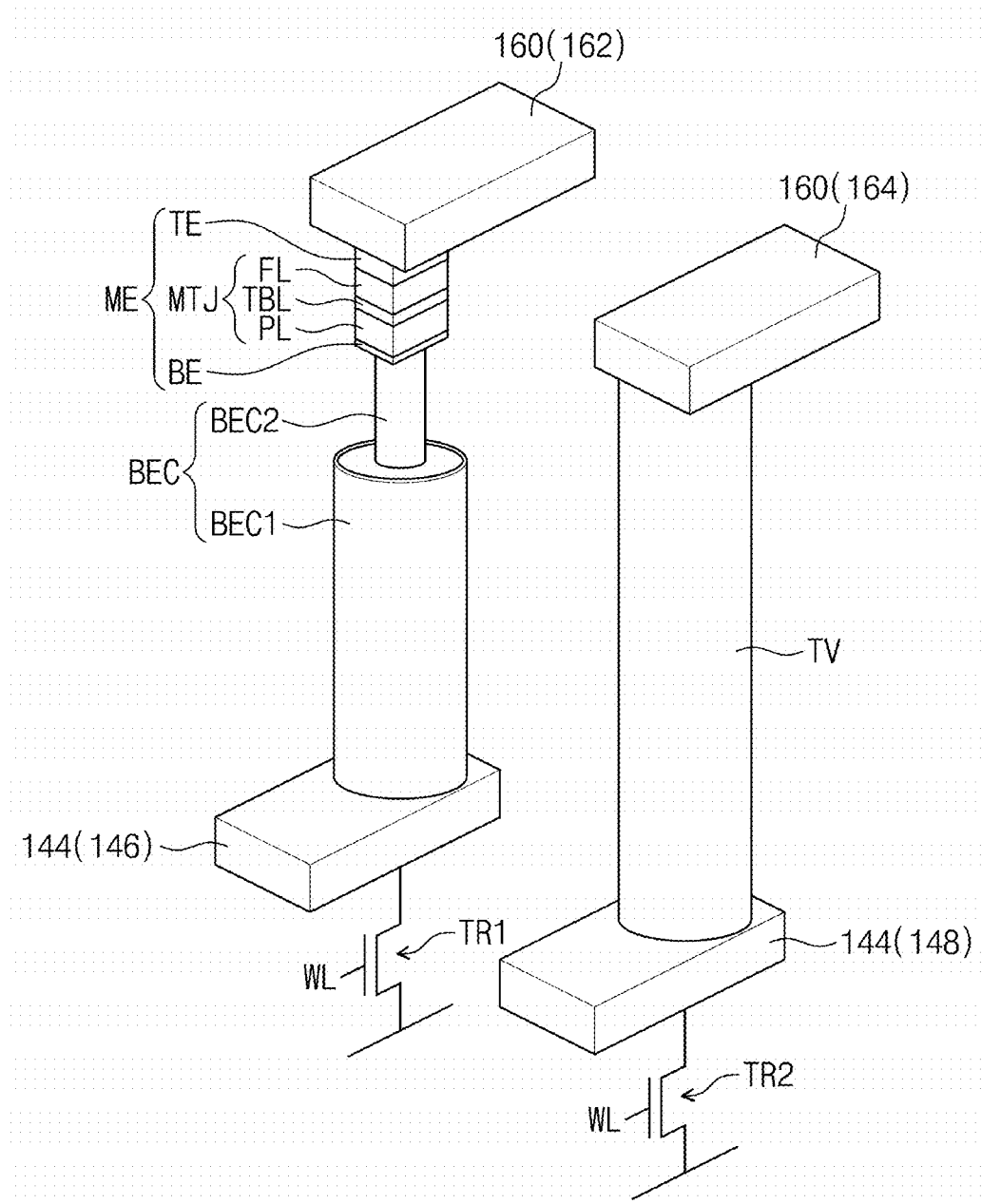
FIG. 2 illustrates an exemplary diagram showing a semiconductor device according to some example embodiments of the present inventive concepts.
Figure 3:
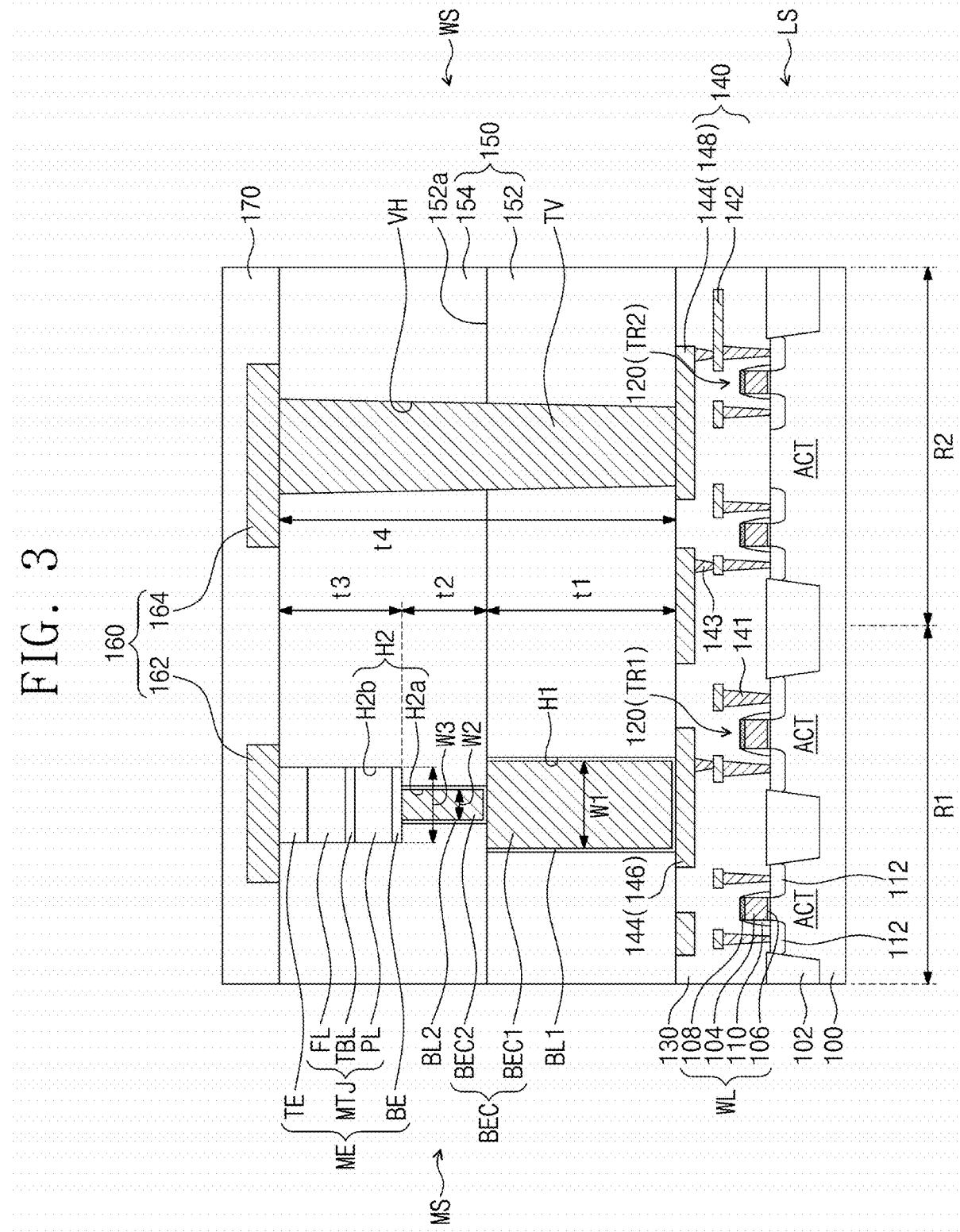
FIG. 3 illustrates a cross-sectional view showing a semiconductor device according to some example embodiments of the present inventive concepts.

FIG. 2 illustrates an exemplary diagram showing a semiconductor device according to some example embodiments of the present inventive concepts. FIG. 3 illustrates a cross-sectional view that corresponds to that of FIG. 2, showing a semiconductor device according to some example embodiments of the present inventive concepts.

Referring to FIGS. 2 and 3, a substrate 100 may be provided. The substrate 100 may be a silicon substrate, a silicon-germanium substrate, a germanium substrate, or a single-crystalline epitaxial layer grown on a single-crystalline silicon substrate. For example, the substrate 100 may be a silicon wafer having a first conductive type (e.g., p-type). The substrate 100 may have a first region R1 and a second region R2. The first region R1 and the second region R2 may be horizontally spaced apart from each other.

A logic structure LS may include a horizontal connection pattern 140 and transistors 120 integrated on the substrate 100.

One or more transistors 120 may be formed on the substrate 100. The substrate 100 may be provided therein with a device isolation layer 102 defining active regions ACT. The device isolation layer 102 may include a dielectric material, such as nitride and/or oxide. The active regions ACT may be disposed spaced apart from each other. In some example embodiments, when viewed in plan, the active regions ACT may be two-dimensionally arranged along a plurality of rows and a plurality of columns. The active regions ACT may be doped with impurities having a first conductivity type.

The substrate 100 may be provided thereon with word lines WL running across the active regions ACT. The word line WL may include a gate electrode 104 on the substrate 100, a gate dielectric layer 106 between the gate electrode 104 and the active regions ACT, and a gate mask pattern 108 on the gate electrode 104. The gate electrode 104 may include a semiconductor material such as doped silicon, a metallic material such as tungsten, aluminum, titanium, and/or tantalum, a conductive metal nitride material such as titanium nitride, tantalum nitride, and/or tungsten nitride, or a metal-semiconductor compound such as metal silicide. The gate dielectric layer 106 may include oxide, nitride, oxynitride, and/or high-k dielectric such as hafnium oxide. The gate mask pattern 108 may include oxide, nitride, and/or oxynitride. Gate spacers 110 may be disposed on sidewalls of the gate electrode 104. The gate spacers 110 may include silicon nitride and/or silicon oxynitride. Although not shown, the gate dielectric layer 106 may extend into gaps between the gate electrode 104 and the gate spacers 110.

Impurity regions 112 may be disposed on edges of the active region ACT on opposite sides of the word line WL. The impurity regions 112 may correspond to source/drain regions of the transistors 120. The impurity regions 112 may be doped with impurities having a second conductivity type different from the first conductivity type of the active regions ACT. One of the first and second conductivity type impurities may be an n-type dopant, and the other of the first and second conductivity type impurities may be a p-type dopant. The transistors 120 may be, for example, planar transistors.

The transistors 120 may include a first transistor TR1 provided on the first region R1 and a second transistor TR2 provided on the second region R2. The first transistor TR1 may be a selection element of the logic structure LS discussed with reference to FIG. 1. The second transistor TR2 may be either a logic circuit or a memory peripheral circuit for driving memory cells of the logic structure LS discussed with reference to FIG. 1.

In some example embodiments, the active regions ACT may include fins that protrude in a direction perpendicular to the substrate 100. For example, the transistors 120 may have structures of FinFET devices. The following will discuss the embodiment shown in FIG. 3.

The substrate 100 may be provided thereon with an interlayer insulation layer 130 covering the word lines WL. The interlayer insulation layer 130 may include silicon oxide, silicon nitride, and/or silicon oxynitride.

The horizontal connection pattern 140 may be provided in the interlayer insulation layer 130. The horizontal connection pattern 140 may include multi-layered conductive patterns 142 and 144. For example, the horizontal connection pattern 140 may include a first lower conductive pattern 142 and a second lower conductive pattern 144.

The first lower conductive pattern 142 may be coupled to the impurity region 112 through a first contact plug 141 penetrating the interlayer insulation layer 130. On one active region ACT, a pair of first contact plugs 141 coupled to the impurity regions 112 may be horizontally spaced apart from each other across one word line WL. A portion of the first lower conductive pattern 142 connected to a source of the first transistor TR1 may correspond to a source line of the first transistor TR1. Alternatively, a portion of the first lower conductive pattern 142 connected to a source of the first transistor TR1 may correspond to a bit line.

The second lower conductive pattern 144 may be located at a level from the substrate 100 higher than that of the first lower conductive pattern 142. The second lower conductive pattern 144 may be coupled to the first lower conductive pattern 142 through a second contact plug 143 penetrating the interlayer insulation layer 130. The second lower conductive pattern 144 may be exposed on a top surface of the interlayer insulation layer 130. The second lower conductive pattern 144 may have a top surface at substantially the same level as that of the top surface of the interlayer insulation layer 130. For example, the top surface of the interlayer insulation layer 130 may be coplanar with that of the second lower conductive pattern 144.

The second lower conductive pattern 144 may include a first conductive pattern 146 positioned on the first region R1 and a second conductive pattern 148 positioned on the second region R2. The first conductive pattern 146 may be connected to the first transistor TR1, and the second conductive pattern 148 may be connected to the second transistor TR2. The first and second conductive patterns 146 and 148 may be located at the same level. The first and second conductive patterns 146 and 148 may have their top surfaces coplanar with that of the interlayer insulation layer 130.

A metallic material may be included in the first and second lower conductive patterns 142 and 144 and in the first and second contact plugs 141 and 143. For example, the first and second lower conductive patterns 142 and 144 may include copper (Cu), and the first and second contact plugs 141 and 143 may include tungsten (W).

Accordingly, the logic structure LS may be provided which includes the transistors 120, the horizontal connection pattern 140, and the interlayer insulation layer 130. If necessary, or alternatively, desired, the logic structure LS may further include a passive element, such as a resistor or a capacitor.

An insulation layer 150 may be disposed on the interlayer insulation layer 130 of the logic structure LS. The insulation layer 150 may cover all of the first and second regions R1 and R2 of the substrate 100. The insulation layer 150 may include a first insulation layer 152 disposed on the interlayer insulation layer 130 and a second insulation layer 154 disposed on the first insulation layer 152. The first and second insulation layers 152 and 154 may include silicon oxide, silicon nitride, and/or silicon oxynitride.

A memory structure MS may be provided on the substrate 100. The memory structure MS may be disposed on the first region R1 of the substrate 100. The memory structure MS may be placed on the interlayer insulation layer 130 of the logic structure LS. The memory structure MS may include a memory element ME provided in the insulation layer 150 and a bottom electrode contact BEC that connects the memory element ME to the first conductive pattern 146. When the memory element ME is provided in plural, the plurality of memory elements ME may have their island shapes arranged two-dimensionally, that is the plurality of memory elements ME may be arranged in a plan according to a pattern.

The bottom electrode contact BEC may include a first bottom electrode contact BEC1 and a second bottom electrode contact BEC2. The second bottom electrode contact BEC2 may be disposed on the first bottom electrode contact BEC1.

The first bottom electrode contact BEC1 may be disposed in the first insulation layer 152. The first bottom electrode contact BEC1 may penetrate, or extend through the entirety of, the first insulation layer 152 and may connect the first conductive pattern 146 to the second bottom electrode contact BEC2. For example, the first bottom electrode contact BEC1 may fill a first contact hole H1 that is formed to vertically penetrate the first insulation layer 152. The first bottom electrode contact BEC1 may have a top surface coplanar with a top surface 152s of the first insulation layer 152. The first bottom electrode contact BEC1 may include a conductive material. For example, the first bottom electrode contact BEC1 may include tungsten (W), aluminum (Al), titanium (Ti), and/or tantalum (Ta). Alternatively, the first bottom electrode contact BEC1 may include conductive metal nitride, such as titanium nitride or tantalum nitride.

A first barrier layer BL1 may be disposed between the first bottom electrode contact BEC1 and the first insulation layer 152. The first barrier layer BL1 may separate the first bottom electrode contact BEC1 from an inner wall of the first contact hole H1. The first barrier layer BL1 may extend from a lateral surface of the first bottom electrode contact BEC1 onto a bottom surface of the first bottom electrode contact BEC1. For example, the first barrier layer BL1 may cover the lateral and bottom surfaces of the first bottom electrode contact BEC1. The first barrier layer may have a bottom surface coplanar with the interface of the first insulation layer 152 and the interlayer insulation layer 130. The first barrier layer BL1 may include conductive metal nitride, such as titanium nitride or tantalum nitride. If necessary, or desired, no first barrier layer BL1 may be provided.

The second bottom electrode contact BEC2 may be disposed on the first bottom electrode contact BEC1. The second bottom electrode contact BEC2 may be located at a level higher than that of the first insulation layer 152. The second bottom electrode contact BEC2 may penetrate, or extend through a portion of, the second insulation layer 154 and may have a connection with the first bottom electrode contact BEC1. The second bottom electrode contact BEC2 may be positioned in a lower portion of the second insulation layer 154. For example, the second bottom electrode contact BEC2 may fill a lower segment H2a of a second contact hole H2 that is formed to vertically penetrate the second insulation layer 154. When viewed in plan, the second contact hole H2 may overlap the first contact hole H1, and the first and second contact holes H1 and H2 may be spatially connected to each other. The lower segment H2a of the second contact hole H2 may have a width less than that of the first contact hole H1, and thus the second bottom electrode contact BEC2 may have a width W2 less than a width W1 of the first bottom electrode contact BEC1. The second bottom electrode contact BEC2 may have a height t2 less than 10 times the width W2 of the second bottom electrode contact BEC2. In this case, the second bottom electrode contact BEC2 may have an aspect ratio of less than 10. In this description, the term "aspect ratio" may be defined to refer to a ratio of height to width. The second bottom electrode contact BEC2 may have a top surface at a level lower than that of a top surface of the second insulation layer 154. The second bottom electrode contact BEC2 may include a conductive material. For example, the second bottom electrode contact BEC2 may include tungsten (W), aluminum (Al), titanium (Ti), and/or tantalum (Ta). Alternatively, the second bottom electrode contact BEC2 may include conductive metal nitride, such as titanium nitride or tantalum nitride.

A second barrier layer BL2 may be disposed between the second bottom electrode contact BEC2 and the second insulation layer 154. The second barrier layer BL2 may separate the second bottom electrode contact BEC2 from an inner wall of the second contact hole H2. The second barrier layer BL2 may extend from a lateral surface of the second bottom electrode contact BEC2 onto a bottom surface of the second bottom electrode contact BEC2. For example, the second barrier layer BL2 may cover the lateral and bottom surfaces of the second bottom electrode contact BEC2. The second barrier layer BL2 may separate the second bottom electrode contact BEC2 from the first bottom electrode contact BEC1. The second barrier layer BL2 may include conductive metal nitride, such as titanium nitride or tantalum nitride. If necessary, or desired, no second barrier layer BL2 may be provided.

The memory element ME may be disposed on the bottom electrode contact BEC. The memory element ME may be placed on the second bottom electrode contact BEC2. The memory element ME may be positioned in the second insulation layer 154. The memory element ME may penetrate the second insulation layer 154 and may have connection with the second bottom electrode contact BEC2. The memory element ME may be provided in an upper portion of the second insulation layer 154. For example, the memory element ME may fill an upper segment H2b of the second contact hole H2 that is formed to vertically penetrate the second insulation layer 154. The upper segment H2b of the second contact hole H2 may have a width greater than that of the lower segment H2a of the second contact hole H2, and therefore the memory element ME may have a width W3 greater than the width W2 of the second bottom electrode contact BEC2. Therefore, a decreased area may be given to an interface between the memory element ME and the second bottom electrode contact BEC2, and a reduce power may be required to a reset operation. It may thus be possible to improve electrical characteristics of a semiconductor device. Furthermore, the width W3 of the memory element ME may be less than the width W1 of the first bottom electrode contact BEC1. The memory element ME may be disposed above the first conductive pattern 146, and may be connected through the bottom electrode contact BEC to the first conductive pattern 146. The memory element ME may have a top surface coplanar with that of the second insulation layer 154.

The memory element ME may be formed to have a thin film whose electrical resistance can be changed using a spin transferring phenomenon of electrical current flowing through the memory element ME. The memory element ME may have a thin-film structure configured to exhibit magneto-resistance properties, and may include at least one ferromagnetic material and/or at least one anti-ferromagnetic material. For example, the memory element ME may be a magnetic memory element including a magnetic tunnel junction MTJ.

The magnetic tunnel junction MTJ may include a pinned layer PL, a free layer FL, and a tunnel barrier layer TBL interposed between the pinned and free layers PL and FL. The pinned layer PL may have a magnetization direction fixed in one direction, and the free layer FL may have a magnetization direction capable of being orientated parallel or antiparallel to the magnetization direction of the pinned layer PL. The magnetic tunnel junction MTJ may have an electrical resistance that is changed depending on the magnetization directions of the pinned layer PL and the free layer FL. When the pinned layer PL and the free layer FL have parallel magnetization directions, the magnetic tunnel junction MTJ may have a low resistance state and may be written with '0' corresponding to a first data. In contrast, when the pinned layer PL and the free layer FL have antiparallel magnetization directions, the magnetic tunnel junction MTJ may have a high resistance state and may be written with '1' corresponding to a second data.

Figure 4:
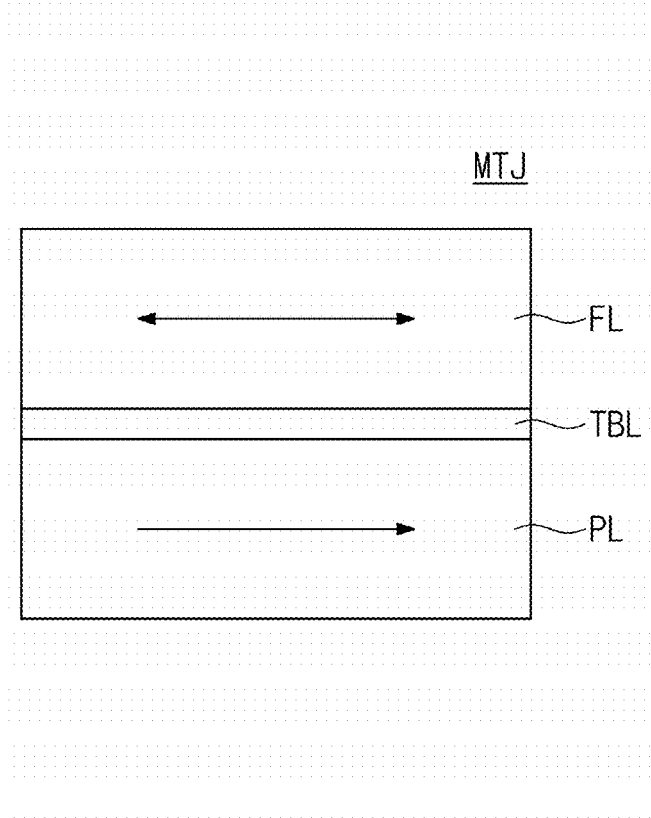
FIGS. 4 and 5 illustrate conceptual diagrams showing a magnetic tunnel junction according to some example embodiments of the present inventive concepts.
Figure 5:
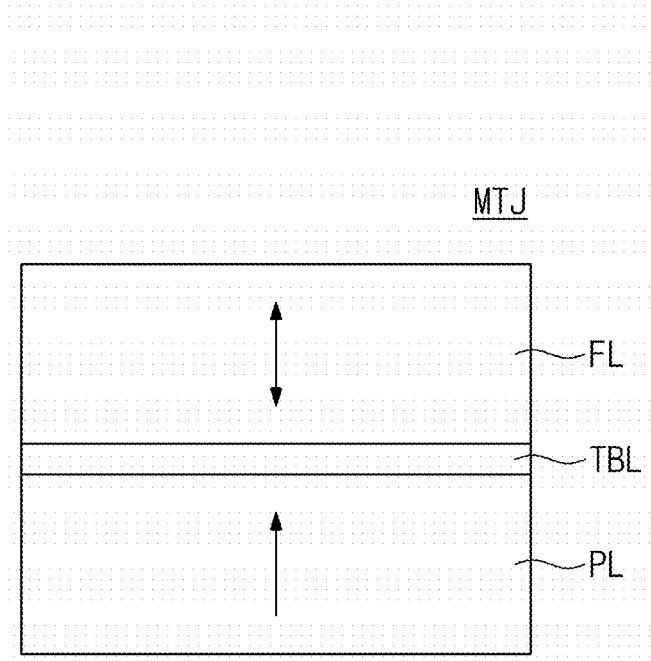

FIGS. 4 and 5 illustrate conceptual diagrams showing the magnetic tunnel junction MTJ according to some example embodiments of the present inventive concepts. The magnetic tunnel junction MTJ may have an electrical resistance dependent on the magnetization directions of the pinned layer PL and the free layer FL. For example, the electrical resistance of the magnetic tunnel junction MTJ may be much greater when the pinned and free layers PL and FL have antiparallel magnetization directions than when the pinned and free layers PL and FL have parallel magnetization directions. In conclusion, the electrical resistance of the magnetic tunnel junction MTJ may be adjusted by changing the magnetization direction of the free layer FL, which may be used as a data storage principle of magnetic memory according to some example embodiments of the present inventive concepts.

Referring to FIG. 4, the pinned layer PL and the free layer FL may be magnetic layers configured to create an in-plane magnetization structure in which the pinned layer PL and the free layer FL have magnetization directions substantially parallel to a top surface of the tunnel barrier layer TBL. In this case, the pinned layer PL may include a layer having an anti-ferromagnetic material and a layer having a ferromagnetic material. In some example embodiments, the layer having an anti-ferromagnetic material may include one or more of PtMn, IrMn, MnO, MnS, MnTe, $MnF_2$, $FeCl_2$, FeO, $CoCl_2$, CoO, $NiCl_2$, NiO, and Cr. In other embodiments, the layer having an anti-ferromagnetic material may include at least one selected from precious metals. The precious metals may include ruthenium (Ru), rhodium (Rh), palladium (Pd), osmium (Os), iridium (Ir), platinum (Pt), gold (Au), and/or silver (Ag). The layer having a ferromagnetic material may include one or more of CoFeB, Fe, Co, Ni, Gd, Dy, CoFe, NiFe, MnAs, MnBi, MnSb, $CrO_2$, $MnOFe_2O_3$, $FeOFe_2O_3$, $NiOFe_2O_3$, $CuOFe_2O_3$, $MgOFe_2O_3$, EuO, and $Y_3Fe_5O_{12}$.

The free layer FL may include a material having a changeable magnetization direction. The free layer FL may include a ferromagnetic material. For example, the free layer FL may include one or more of CoFeB, Fe, Co, Ni, Gd, Dy, CoFe, NiFe, MnAs, MnBi, MnSb, $CrO_2$, $MnOFe_2O_3$, $FeOFe_2O_3$, $NiOFe_2O_3$, $CuOFe_2O_3$, $MgOFe_2O_3$, EuO, and $Y_3Fe_5O_{12}$. The free layer FL may consist of a plurality of layers. For example, the free layer FL may include layers having a plurality of ferromagnetic materials and a layer having a non-magnetic material between the layers. In this case, the layers having the ferromagnetic materials and the layer having the non-magnetic material may constitute a synthetic anti-ferromagnetic layer. The synthetic anti-ferromagnetic layer may reduce critical current density and enhance thermal stability of a magnetic memory device.

The tunnel barrier layer TBL may include one or more of oxide of magnesium (Mg), oxide of titanium (Ti), oxide of aluminum (Al), oxide of magnesium-zinc (MgZn), oxide of magnesium-boron (MgB), nitride of titanium (Ti), and nitride of vanadium (V). For example, the tunnel barrier layer TBL may be a single or monolayer of magnesium oxide (MgO). For another example, the tunnel barrier layer TBL may include a plurality of layers.

Referring to FIG. 5, the pinned layer PL and the free layer FL may have a perpendicular magnetization structure in which the pinned layer PL and the free layer FL have magnetization directions substantially perpendicular to the top surface of the tunnel barrier layer TBL. In this case, each of the pinned layer PL and the free layer FL may include one or more of a material having an $L_{10}$ crystal structure, a material having a hexagonal closed-packed lattice, and an amorphous rare-earth transition metal (RE-TM) alloy. For example, each of the pinned layer PL and the free layer FL may include at least one material having an $L_{10}$ crystal structure, such as $Fe_{50}Pt_{50}$, $Fe_{50}Pd_{50}$, $Co_{50}Pt_{50}$, $Co_{50}Pd_{50}$, $Fe_{50}Ni_{50}$, etc. For another example, each of the pinned layer PL and the free layer FL may include a $Co_3Pt$ ordered alloy or a cobalt-platinum (CoPt) disordered alloy that have a hexagonal close-packed lattice and a platinum (Pt) content ranging from 10 to 45 at %. For another example, each of the pinned layer PL and the free layer FL may include at least one of amorphous RE-TM alloys that contain at least one selected from iron (Fe), cobalt (Co), and nickel (Ni) and at least one of rare earth metals such as terbium (Tb), dysprosium (Dy), and gadolinium (Gd).

The pinned layer PL and the free layer FL may include a material having interface perpendicular magnetic anisotropy. The interface perpendicular magnetic anisotropy may refer to a phenomenon where a magnetic layer having intrinsic in-plane magnetization properties is caused to have a perpendicular magnetization direction due to an effect from an interface with another layer adjacent to the magnetic layer. Herein, the term "intrinsic in-plane magnetic properties" may mean that a magnetic layer has a magnetization direction parallel to its widest surface when there is no external factor. For example, when a substrate is provided thereon with a magnetic layer having intrinsic in-plane magnetization properties and no external factor is applied, a magnetization direction of the magnetic layer may be oriented substantially parallel to a top surface of the substrate. Each of the pinned layer PL and the free layer FL may include, for example, one or more of cobalt (Co), iron (Fe), and nickel (Ni). In addition, each of the pinned layer PL and the free layer FL may further include at least one non-magnetic material including boron (B), zinc (Zn), aluminum (Al), titanium (Ti), ruthenium (Ru), tantalum (Ta), silicon (Si), silver (Ag), gold (Au), copper (Cu), carbon (C), and/or nitrogen (N). For example, each of the pinned layer PL and the free layer FL may include CoFe or NiFe and may further include boron (B). Moreover, each of the pinned layer PL and the free layer FL may further include one or more of titanium (Ti), aluminum (Al), magnesium (Mg), tantalum (Ta), and silicon (Si), which may reduce saturation magnetization.

Referring still to FIGS. 2 and 3, the memory element ME may further include a bottom electrode BE and a top electrode TE. The magnetic tunnel junction MTJ may be interposed between the bottom electrode BE and the top electrode TE. For example, the bottom electrode BE may be disposed between the bottom electrode contact BEC and the magnetic tunnel junction MTJ, and the top electrode TE may be disposed on the magnetic tunnel junction MTJ. The top electrode TE may be exposed on the top surface of the second insulation layer 154, and may have a top surface coplanar with that of the second insulation layer 154. Each of the bottom and top electrodes BE and TE may include one or more of conductive metal nitride (e.g., titanium nitride or tantalum nitride), transition metal (e.g., titanium or tantalum), and/or rare earth metal (e.g., ruthenium or platinum).

Accordingly, a memory structure MS may be provided which includes the memory element ME and the bottom electrode contact BEC.

A wiring structure WS may be provided on the substrate 100. The wiring structure WS may be disposed on the second region R2 of the substrate 100. The wiring structure WS may be placed on the interlayer insulation layer 130 of the logic structure LS. The wiring structure WS may include a vertical connection structure.

The vertical connection structure may be electrically connected to the logic circuits and/or the memory peripheral circuits of the logic structure LS. For example, the vertical connection structure may be connected through the second conductive pattern 148 to the second transistor TR2. The vertical connection structure may include a through electrode TV penetrating the insulation layer 150. The through electrode TV may penetrate the first and second insulation layers 152 and 154, and may be coupled to the second conductive pattern 148. For example, the through electrode TV may fill a via hole VH that is formed to penetrate the first and second insulation layers 152 and 154. The via hole VH may have a width greater than that of the upper segment H2$b$ of the second contact hole H2, and therefore the through electrode TV may have a width greater than the width W3 of the memory element ME. The through electrode TV for connecting the logic structure LS to an upper conductive pattern 160 may be required to have a specific height or more depending on the configuration of a semiconductor device. For example, the through electrode TV may have a height t4 of about 150 Å to about 1,500 Å. The insulation layer 150 may have a thickness that depends on the height t4 of the through electrode TV, and the thickness of the insulation layer 150 may also range from about 150 Å to about 1,500 Å. For example, the through electrode TV may have a height t4 of about 1,000 Å to about 1,500 Å. In addition, the thickness of the second insulation layer 154 may depend on a sum of the height t3 of the memory element ME and the height t2 of the second bottom electrode contact BEC2. Therefore, the first insulation layer 152 may have a thickness (identical to t1) that is determined by a value obtained when subtracting the height t3 of the memory element ME and the height t2 of the second bottom electrode contact BEC2 from the thickness (identical to t4) of the insulation layer 150. The through electrode TV may include metal, such as tungsten (W) and/or copper (Cu).

When the terms "about" or "substantially" are used in this specification in connection with a numerical value, it is intended that the associated numerical value includes a manufacturing or operational tolerance (e.g., ±10%) around the stated numerical value. Moreover, when the words "generally" and "substantially" are used in connection with geometric shapes, it is intended that precision of the geometric shape is not required but that latitude for the shape is within the scope of the disclosure. Further, regardless of whether numerical values or shapes are modified as "about" or "substantially," it will be understood that these values and shapes should be construed as including a manufacturing or operational tolerance (e.g., ±10%) around the stated numerical values or shapes. While the term "same" or "identical" is used in description of example embodiments, it should be understood that some imprecisions may exist. Thus, when one element is referred to as being the same as another element, it should be understood that an element or a value is the same as another element within a desired manufacturing or operational tolerance range (e.g., ±10%).

The upper conductive pattern 160 may be disposed on the memory structure MS and the wiring structure WS. The upper conductive pattern 160 may include a first upper conductive pattern 162 provided on the first region R1 and a second upper conductive pattern 164 provided on the second region R2. The first and second upper conductive patterns 162 and 164 may be located at the same level from the substrate 100. For example, a distance between the first conductive pattern 146 and the first upper conductive pattern 162 may be the same as that between the second conductive pattern 148 and the second upper conductive pattern 164. In this case, the height t4 of the through electrode TV may be the same as a sum of the height t1 of the first bottom electrode contact BEC1, the height t2 of the second bottom electrode contact BEC2, and the height t3 of the memory element ME.

The first upper conductive pattern 162 may be electrically connected to the memory element ME. For example, the first upper conductive pattern 162 may be positioned on the second insulation layer 154, and when viewed in plan, may overlap the memory element ME. The first upper conductive pattern 162 may contact the top electrode TE of the memory element ME. For example, the first bottom electrode contact BEC1, the second bottom electrode contact BEC2, and the memory element ME may be connected in series from the first conductive pattern 146 toward the first upper conductive pattern 162. In addition, the first upper conductive pattern 162 may be connected to the first transistor TR1 through the memory element ME and the first conductive pattern 146. When the first lower conductive pattern 142 is a source line connected to a source of the first transistor TR1, the first upper conductive pattern 162 may correspond to a bit line connected to a drain of the first transistor TR1. Alternatively, when the first lower conductive pattern 142 is a bit line connected to a source of the first transistor TR1, the first upper conductive pattern 162 may correspond to a source line. The first upper conductive pattern 162 may include copper (Cu).

The second upper conductive pattern 164 may be electrically connected to the wiring structure WS. For example, the second upper conductive pattern 164 may be positioned on the second insulation layer 154, and when viewed in plan, may overlap the through electrode TV. The second upper conductive pattern 164 may contact the through electrode TV. The second upper conductive pattern 164 may include copper (Cu). The second upper conductive pattern 164 may be electrically connected through the through electrode TV to the second transistor TR2.

A third insulation layer 170 may be disposed on the second insulation layer 154. On the second insulation layer 154, the third insulation layer 170 may cover the first and second upper conductive patterns 162 and 164. The third insulation layer 170 may include silicon oxide, silicon nitride, and/or silicon oxynitride.

Accordingly, a semiconductor device may be provided.

FIGS. 6 to 16 illustrate cross-sectional views showing a method of fabricating a semiconductor device according to some example embodiments of the present inventive concepts.

Figure 6:
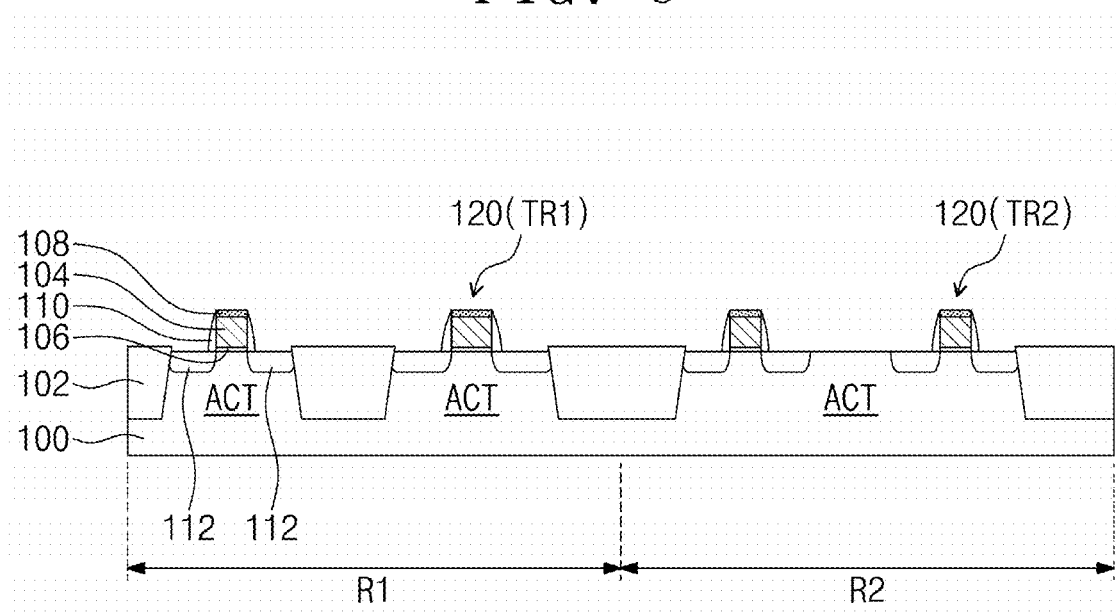
FIGS. 6 to 16 illustrate cross-sectional views showing a method of fabricating a semiconductor device according to some example embodiments of the present inventive concepts.

Referring to FIG. 6, a substrate 100 may be prepared. The substrate 100 may be a silicon substrate, a silicon-germanium substrate, a germanium substrate, and/or a single-crystalline epitaxial layer grown on a single-crystalline silicon substrate. The substrate 100 may have a first region R1 and a second region R2. The first region R1 and the second region R2 may be horizontally spaced apart from each other. The first region R1 may be a portion of an area on which is formed the memory structure MS of FIG. 1, and the second region R2 may be a portion of an area on which is formed the logic structure LS of FIG. 1.

Transistors 120 may be formed on the substrate 100. The substrate 100 may experience an etching process to form a trench, and the trench may be filled with an insulation material to form a device isolation layer 102 defining active regions ACT. The transistors 120 may be formed on the active regions ACT of the substrate 100. The formation of the transistors 120 may include sequentially forming on the substrate 100 a gate dielectric layer 106, a gate electrode 104, and a gate mask pattern 108, and forming impurity regions 112 by implanting impurities into the substrate 100 on opposite sides of the gate electrode 104. Gate spacers 110 may be formed on a sidewall of the gate electrode 104. A first transistor TR1 formed on the first region R1 may be a selection element of the logic structure LS discussed with reference to FIG. 1, and a second transistor TR2 formed on the second region R2 may be a logic circuit and/or a memory peripheral circuit, which are used for operating memory cells, of the logic structure LS discussed with reference to FIG. 1.

Figure 7:
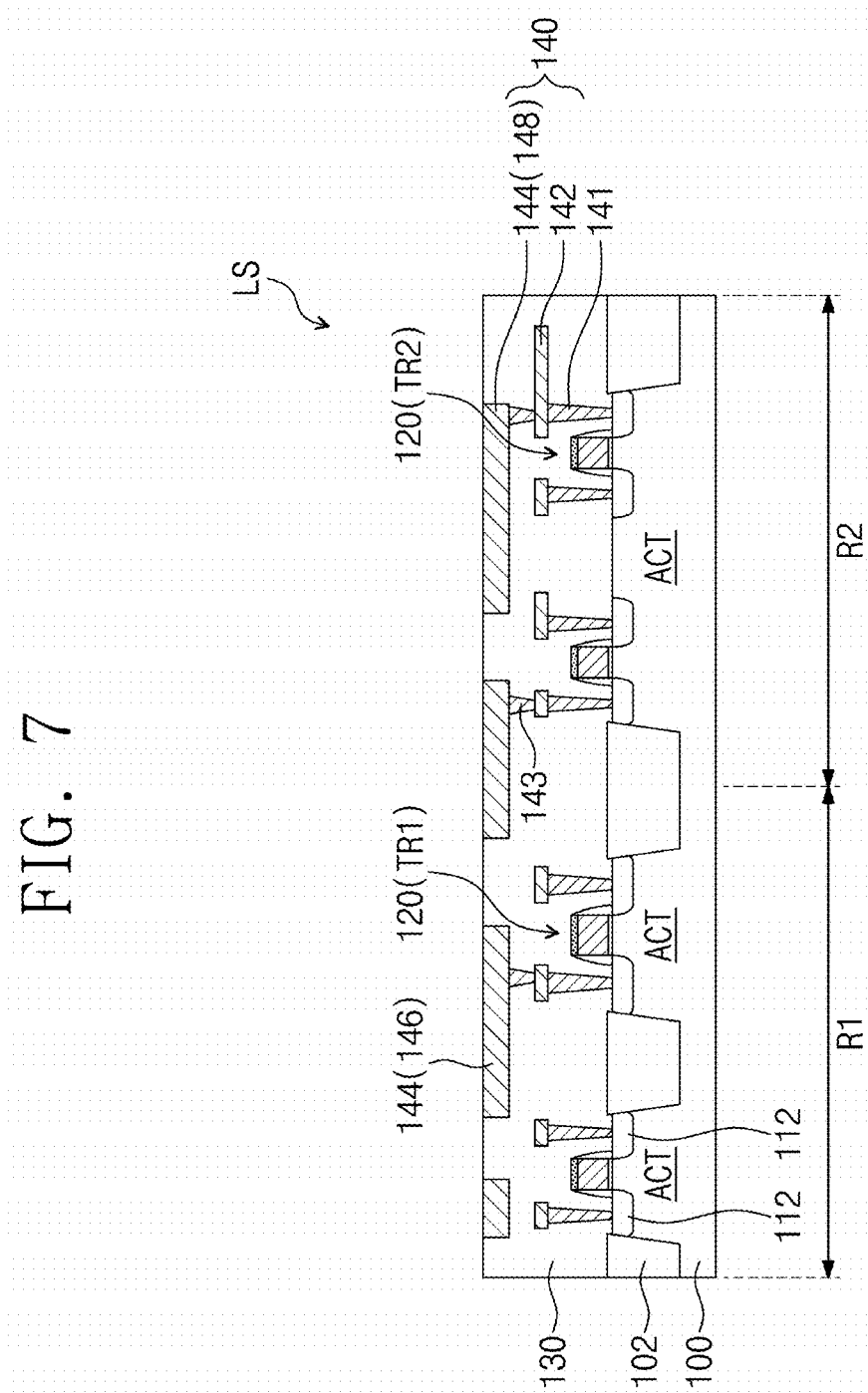

Referring to FIG. 7, there may be formed a horizontal connection pattern 140 connected to the transistors 120, which horizontal connection pattern 140 includes first and second contact plugs 141 and 143 and first and second lower conductive patterns 142 and 144. For example, a first interlayer insulation layer may be formed to cover an entire surface of the substrate 100. The first lower conductive pattern 142 may be formed on the first interlayer insulation layer. The first contact plugs 141 may be formed to penetrate the first interlayer insulation layer, and a conductive layer on the first interlayer insulation layer may be patterned to form the first lower conductive pattern 142. A second interlayer insulation layer may be formed on the first interlayer insulation layer. The second contact plugs 143 may be formed to penetrate the second interlayer insulation layer, and a conductive layer on the second interlayer insulation layer may be patterned to form the second lower conductive pattern 144. The second lower conductive pattern 144 may include a first conductive pattern 146 and a second conductive pattern 148 respectively formed on the first region R1 and the second region R2. A third interlayer insulation layer may be formed on the second interlayer insulation layer. The second lower conductive pattern 144 may be exposed on a top surface of the third interlayer insulation layer. The first to third interlayer insulation layers may constitute an interlayer insulation layer 130 discussed with reference to FIG. 3. The first to third interlayer insulation layers may include silicon oxide (SiOx), silicon nitride (SiN), silicon oxynitride (SiON), and/or low-k insulation. Accordingly, a logic structure LS may be formed.

Figure 8:
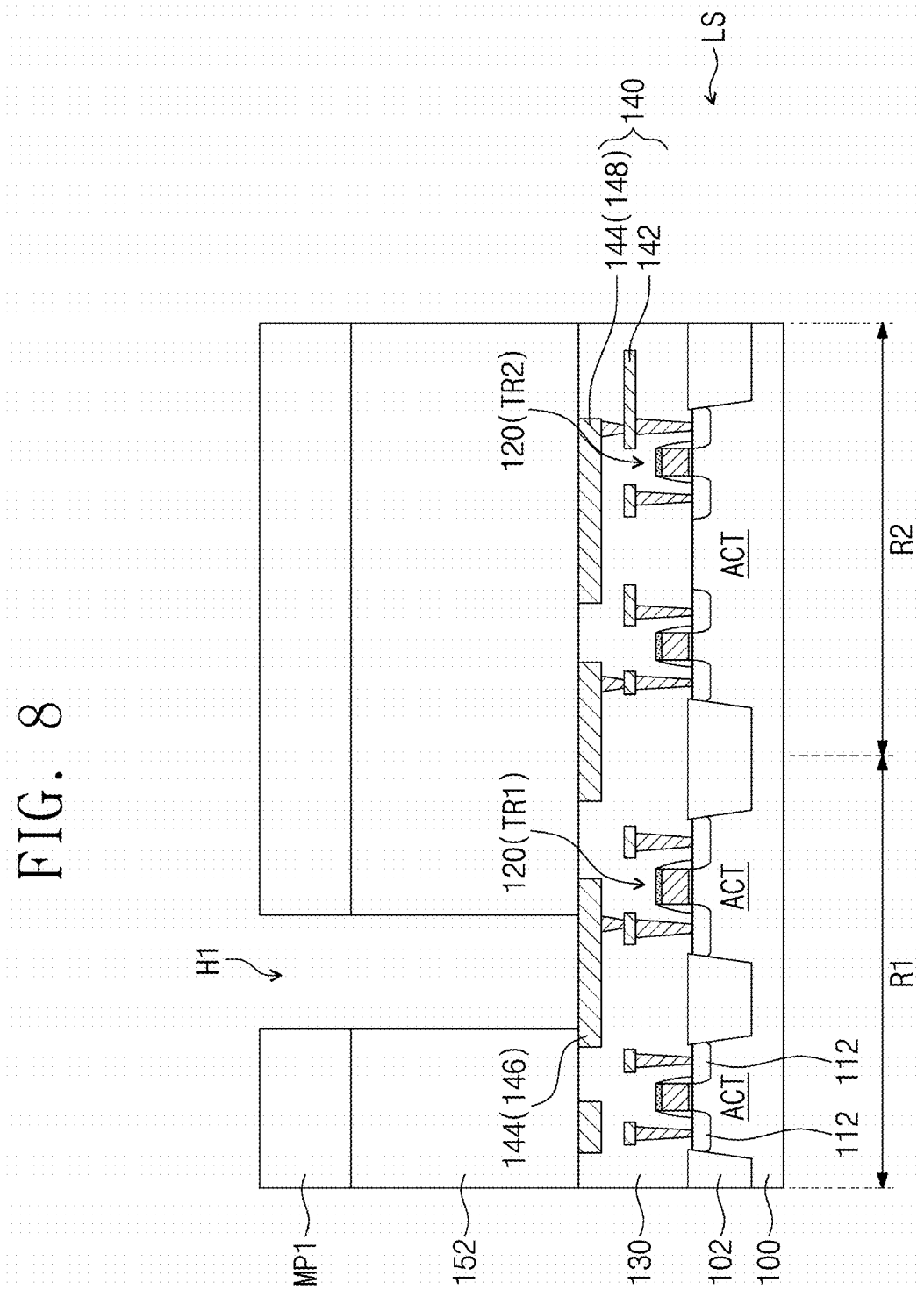

Referring to FIG. 8, a first insulation layer 152 may be formed on the logic structure LS. An insulation material may be deposited or coated to cover the first and second regions R1 and R2 of the substrate 100, thereby forming the first insulation layer 152. The insulation material may include silicon oxide, silicon nitride, and/or silicon oxynitride.

A first mask pattern MP1 may be formed on the first insulation layer 152. The first mask pattern MP1 may overlap the first conductive pattern 146 of the second lower conductive pattern 144.

The first mask pattern MP1 may be used as an etching mask to etch the first insulation layer 152. The etching process may form a first contact hole H1 in the first insulation layer 152. The first contact hole H1 may penetrate the first insulation layer 152 and may expose the first conductive pattern 146.

Figure 9:
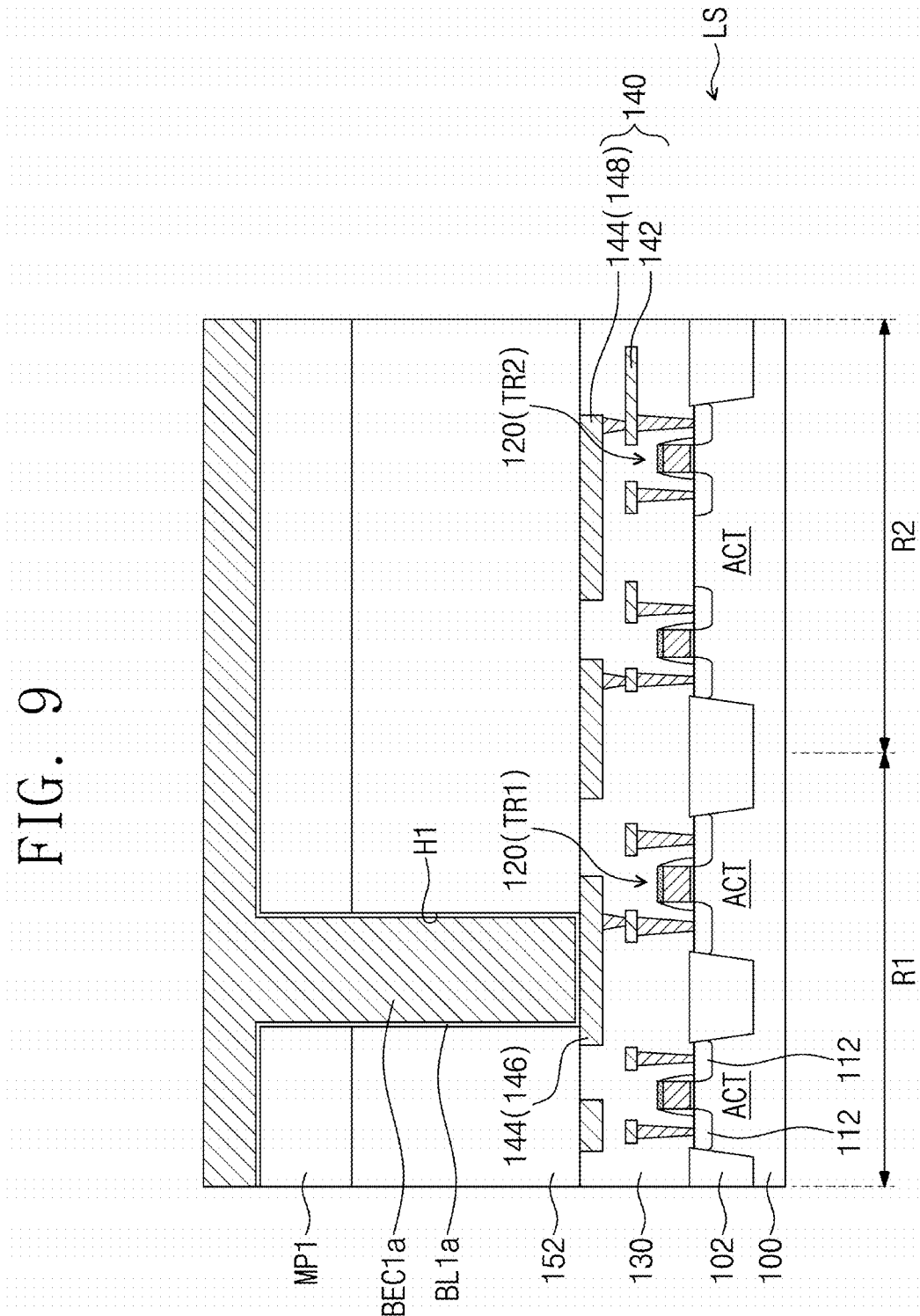

Referring to FIG. 9, a first preliminary barrier layer BL1a may be formed on the substrate 100. For example, the first preliminary barrier layer BL1a may be formed to conformally cover a top surface of the first mask pattern MP1, sidewalls of the first insulation layer 152 exposed to the first contact hole H1, and a top surface of the first conductive pattern 146 exposed to the first contact hole H1. The first preliminary barrier layer BL1a may include conductive metal nitride, such as titanium nitride or tantalum nitride.

A first preliminary bottom electrode contact BEC1a may be formed on the substrate 100. For example, a conductive material may be coated or deposited to fill the first contact hole H1, thereby forming the first preliminary bottom electrode contact BEC1a on the first preliminary barrier layer BL1a. The first preliminary bottom electrode contact BEC1a may cover the first mask pattern MP1. The first preliminary bottom electrode contact BEC1a may include metal, such as tungsten (W), aluminum (Al), titanium (Ti), and/or tantalum (Ta), and/or may include conductive metal nitride, such as titanium nitride and/or tantalum nitride.

Figure 10:
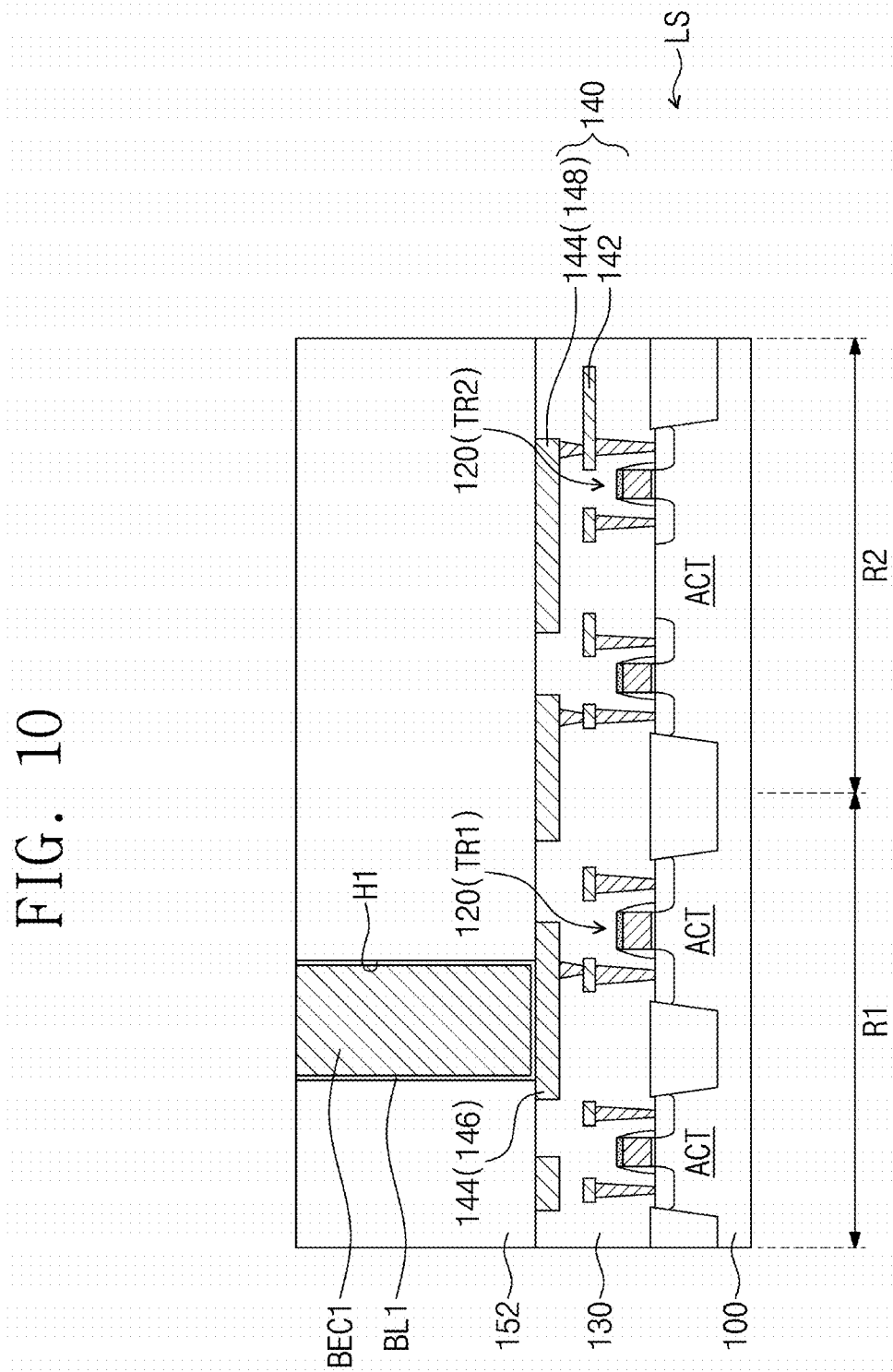

Referring to FIG. 10, the first preliminary bottom electrode contact BEC1a and the first preliminary barrier layer BL1a may experience a planarization process to form a first bottom electrode contact BEC1 and a first barrier layer BL1. The planarization process may remove the first mask pattern MP1. The planarization process may expose a top surface of the first insulation layer 152. The first bottom electrode contact BEC1 and the first barrier layer BL1 may be formed on the first region R1.

Figure 11:
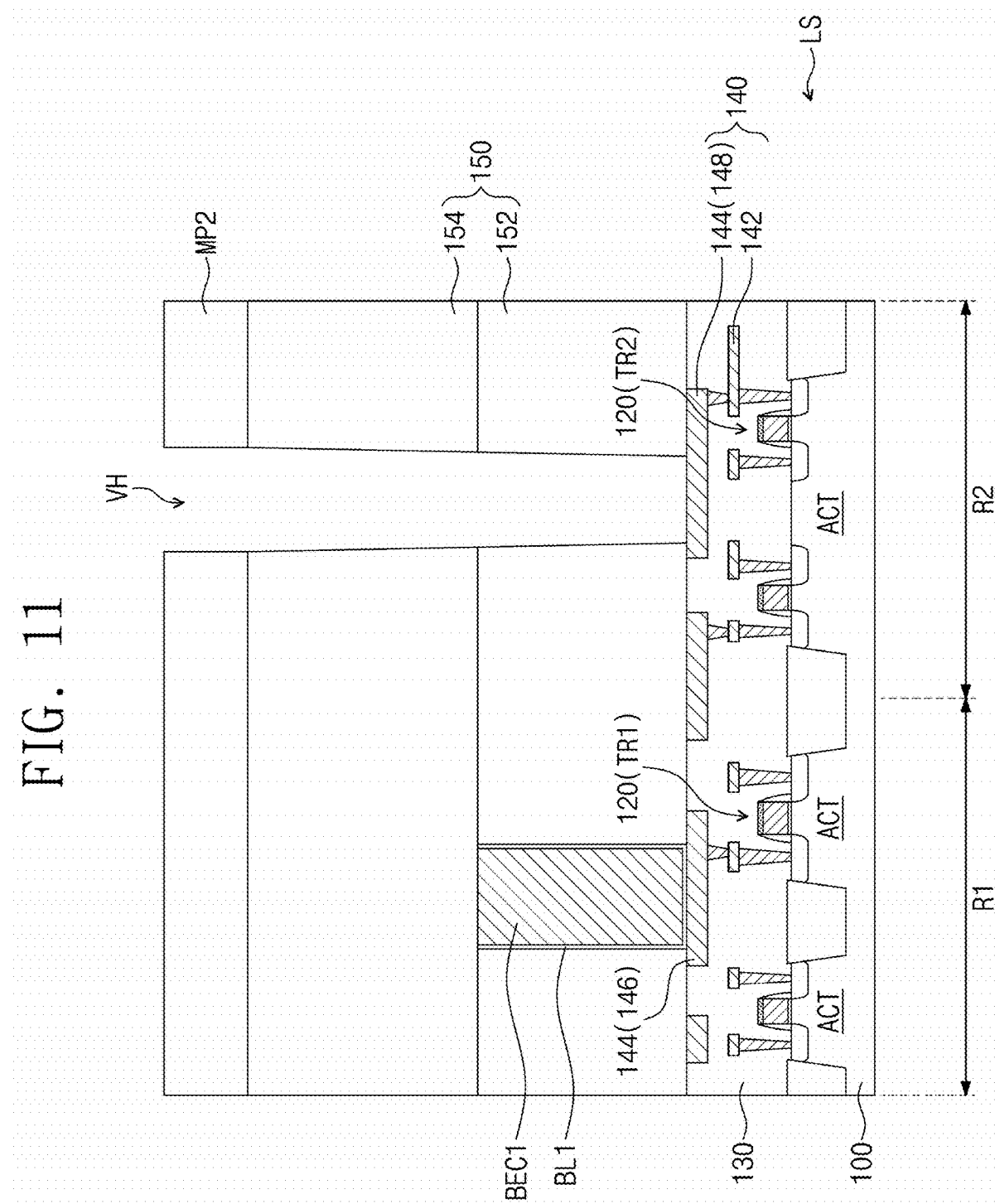

Referring to FIG. 11, a second insulation layer 154 may be formed on the first insulation layer 152. An insulation material may be deposited or coated to cover the first and second regions R1 and R2 of the substrate 100, thereby forming the second insulation layer 154. The insulation layer 150 may have a thickness of about 150 Å to about 1,500 Å which is a sum of thicknesses of the first and second insulation layers 152 and 154. The thickness of the insulation layer 150 may depend on a height of a through electrode (see TV of FIG. 12) required for a semiconductor device. The insulation material may include silicon oxide, silicon nitride, and/or silicon oxynitride.

A second mask pattern MP2 may be formed on the second insulation layer 154. The second mask pattern MP2 may overlap the second conductive pattern 148 of the second lower conductive pattern 144.

The second mask pattern MP2 may be used as an etching mask to etch the first and second insulation layers 152 and 154. The etching process may form a via hole VH in the first and second insulation layers 152 and 154. The via hole VH may penetrate the first and second insulation layers 152 and 154 and may expose the second conductive pattern 148.

Figure 12:
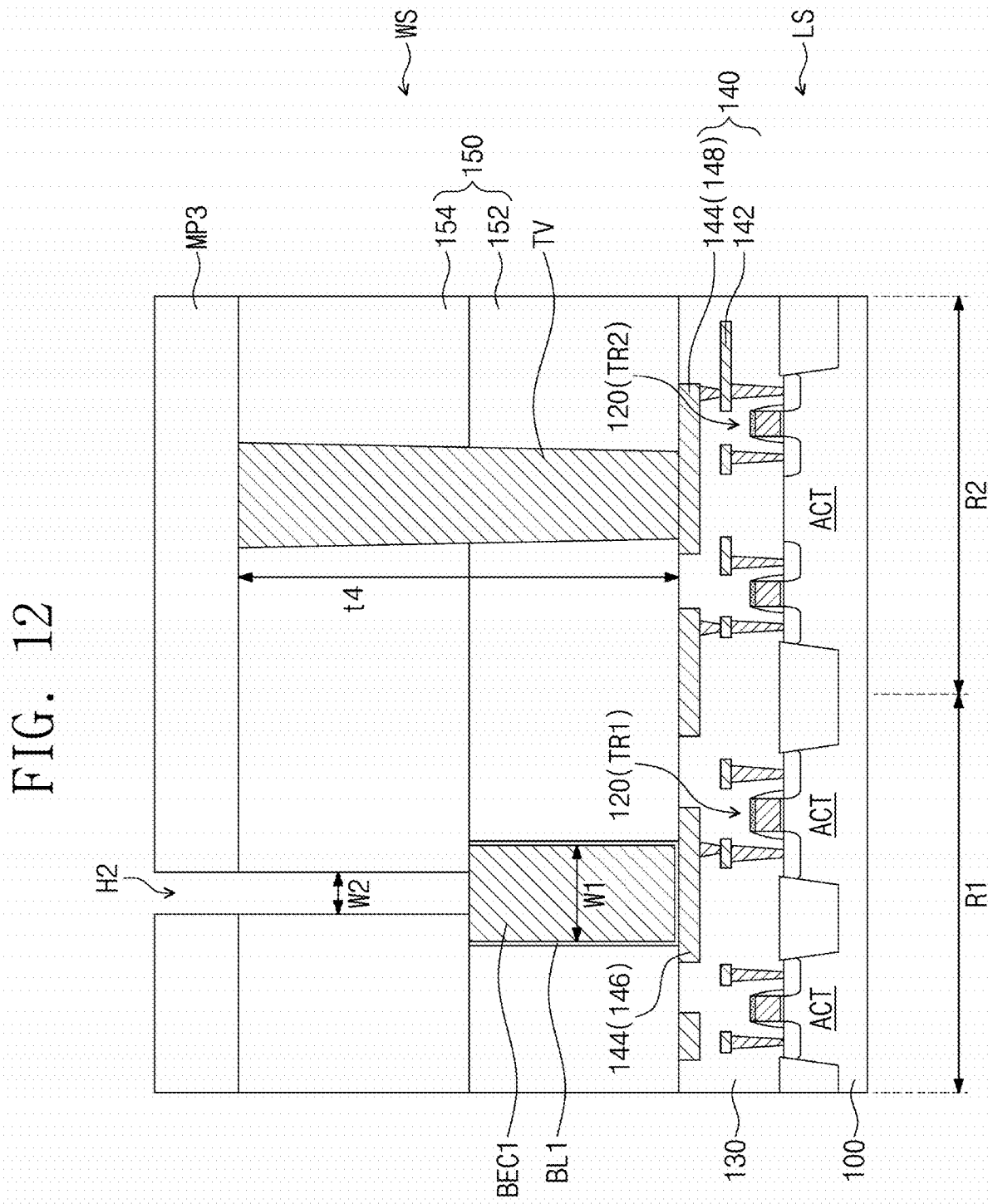

Referring to FIG. 12, a through electrode TV may be formed in the via hole VH. For example, a conductive material may be coated or deposited to fill the via hole VH. The conductive material may cover the second mask pattern (see MP2 of FIG. 11). The conductive material may include metal, such as tungsten (W) or copper (Cu). The conductive material may experience a planarization process to expose a top surface of the second insulation layer 154, thereby forming the through electrode TV. The planarization process may remove the second mask pattern MP2. The through electrode TV may be formed on the second region R2. The through electrode TV may have a height t4 of about 150 Å to about 1,500 Å. The through electrode TV may constitute a wiring structure WS electrically connected to the second transistor TR2.

A third mask pattern MP3 may be formed on the second insulation layer 154. The third mask pattern MP3 may overlap the first conductive pattern 146 of the second lower conductive pattern 144.

The third mask pattern MP3 may be used as an etching mask to etch the second insulation layer 154. The etching process may form a second contact hole H2 in the second insulation layer 154. The second contact hole H2 may penetrate the second insulation layer 154 and may expose the first bottom electrode contact BEC1. The second contact hole H2 may have a width W2 less than a width W1 of the first bottom electrode contact BEC1.

Figure 13:
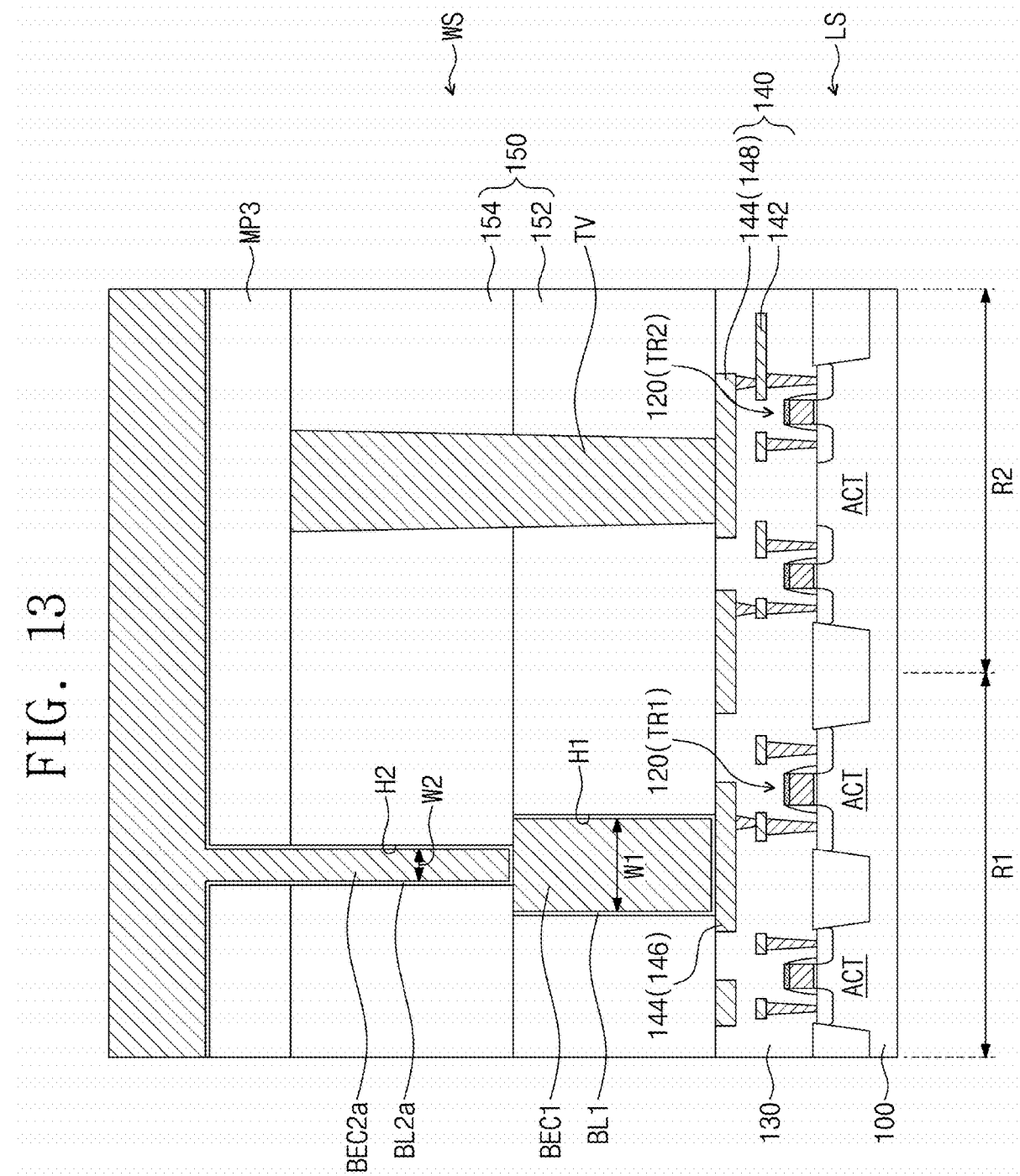

Referring to FIG. 13, a second preliminary barrier layer BL2a may be formed on the substrate 100. For example, the second preliminary barrier layer BL2a may be formed to conformally cover a top surface of the third mask pattern MP3, sidewalls of the second insulation layer 154 exposed to the second contact hole H2, and a top surface of the first bottom electrode contact BEC1 exposed to the second contact hole H2. The second preliminary barrier layer BL2a may include conductive metal nitride, such as titanium nitride or tantalum nitride.

A second preliminary bottom electrode contact BEC2a may be formed on the substrate 100. For example, a conductive material may be coated or deposited to fill the second contact hole H2, thereby forming the second preliminary bottom electrode contact BEC2a on the second preliminary barrier layer BL2a. The second preliminary bottom electrode contact BEC2a may cover the third mask pattern MP3. The second preliminary bottom electrode contact BEC2a may include metal, such as tungsten (W), aluminum (Al), titanium (Ti), and/or tantalum (Ta), and/or may include conductive metal nitride, such as titanium nitride and/or tantalum nitride.

Figure 14:
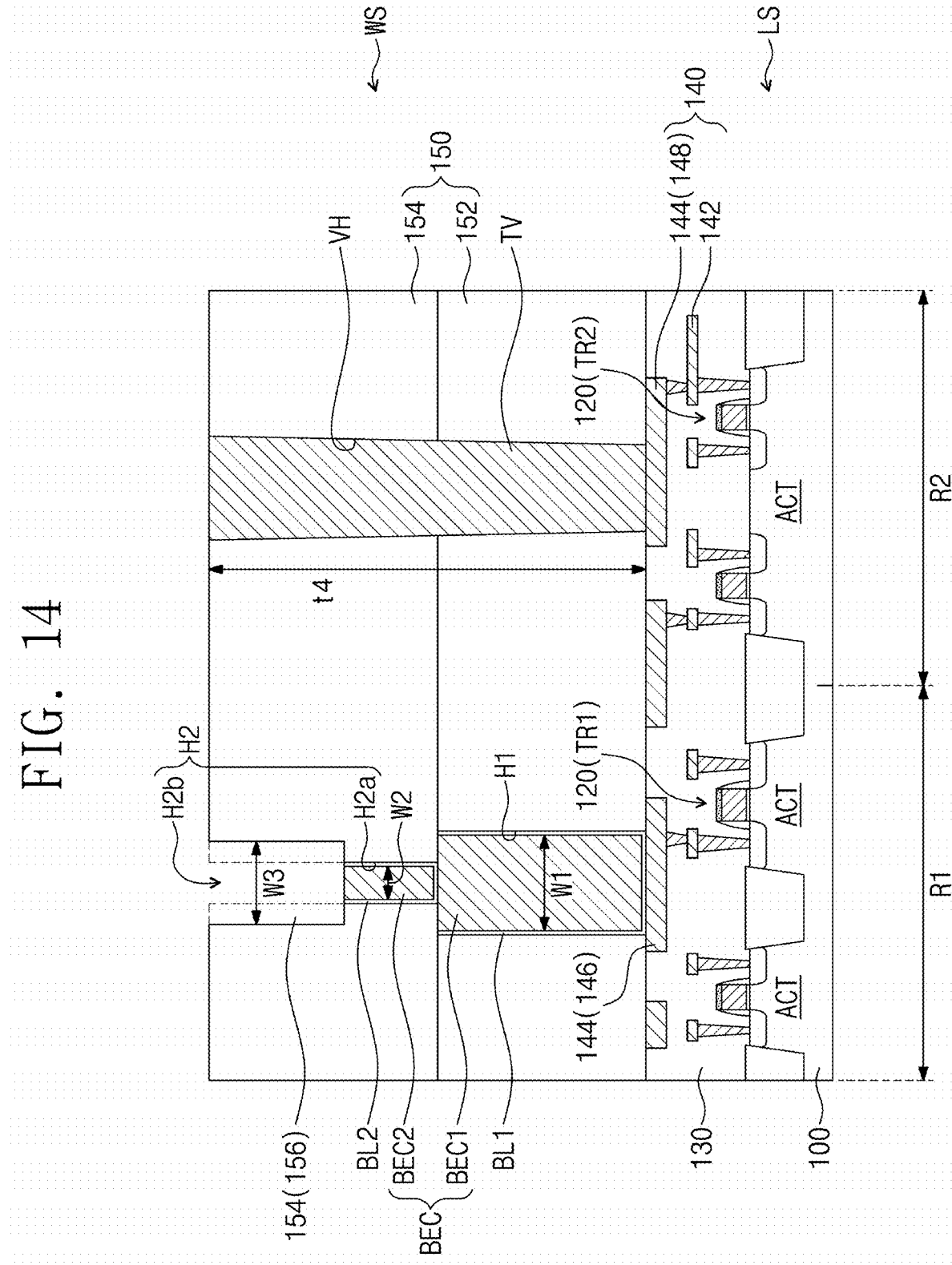

Referring to FIG. 14, the second preliminary bottom electrode contact BEC2a and the second preliminary barrier layer BL2a may experience a planarization process to form a second bottom electrode contact BEC2 and a second barrier layer BL2. The planarization process may remove the third mask pattern MP3. The planarization process may expose the top surface of the second insulation layer 154. The second bottom electrode contact BEC2 and the second barrier layer BL2 may be formed on the first region R1.

The second bottom electrode contact BEC2 and the second barrier layer BL2 may be etched at their upper portions. Therefore, a top surface of the second bottom electrode contact BEC2 and a top surface of the second barrier layer BL2 may be recessed from the top surface of the second insulation layer 154, and an inner space surrounded by the second insulation layer 154 may be formed on the second bottom electrode contact BEC2 and the second barrier layer BL2. Accordingly, the second bottom electrode contact BEC2 and the second barrier layer BL2 may fill a lower segment H2a of the second contact hole H2, and the inner space may be an upper segment H2b of the second contact hole H2.

Accordingly, a bottom electrode contact BEC may be formed which consists of two layers, or the first bottom electrode contact BEC1 and the second bottom electrode contact BEC2.

Figure 15:
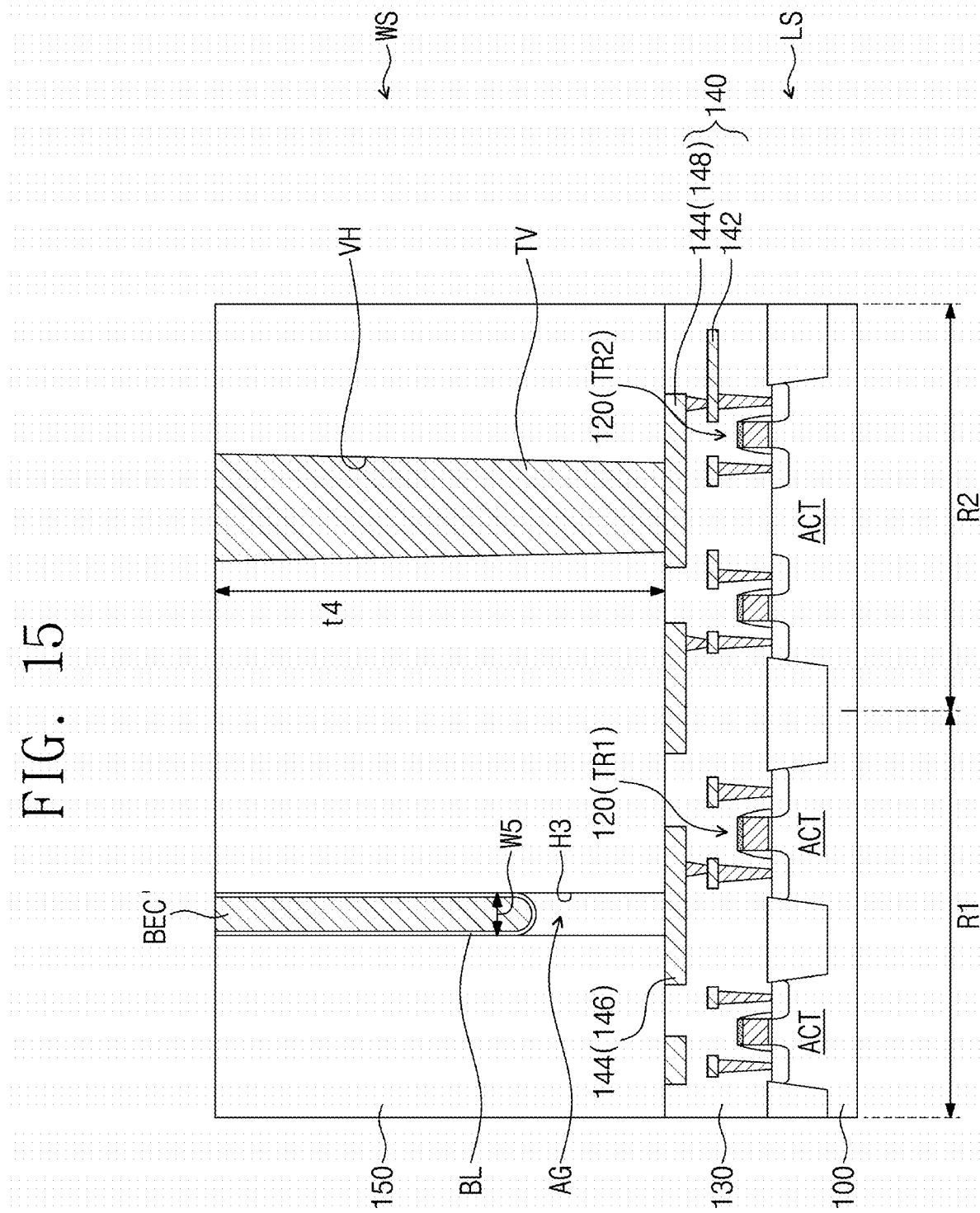

When a bottom electrode contact is formed of a single layer, defects may occur at the bottom electrode contact. FIG. 15 shows a case where a bottom electrode contact BEC' is formed of a single layer, and as shown in FIG. 15, an electrical open may be created in the bottom electrode contact BEC'. The formation of the single-layered bottom electrode contact BEC' may include forming the insulation layer 150 on the logic structure LS. On the second region R2, the through electrode TV may be formed to penetrate the insulation layer 150. The formation process for the through electrode TV may be the same as that discussed with reference to FIGS. 11 and 12. The through electrode TV for connecting the logic structure LS to the upper conductive pattern 160 may be required to have a specific height (e.g., about 1,000 Å or more) depending on the configuration of a semiconductor device. When the height t4 of the through electrode TV becomes larger as discussed above, an increase distance may be provided between the memory element (see ME of FIG. 16) and the first conductive pattern 146.

On the first region R1, the third contact hole H3 may be formed to penetrate the insulation layer 150. The third contact hole H3 may be a space where the bottom electrode contact BEC' is formed. In this case, a contact area between the memory element (se ME of FIG. 3) and the bottom electrode contact BEC' may be formed small enough to improve electrical characteristics at an interface between the memory element ME and the bottom electrode contact BEC'. For example, the third contact hole H3 may be formed to have a width less than that of the memory element ME which will be formed in a subsequent process. The width of the third contact hole H3 may be limited smaller than that of the memory element ME, and when the thickness (identical to t4) of the insulation layer 150 becomes larger as discussed above, the third contact hole H3 may have an increased aspect ratio.

In general, the third contact hole H3 penetrating the insulation layer 150 may be filled with a conductive material to form the bottom electrode contact BEC'. In this case, when the aspect ratio of the third contact hole H3 is greater than 10, it may be difficult to fill the third contact hole H3 with the conductive material due to its wettability. The wettability of the conductive material may determine an introduction depth of the conductive material that flows along a width W5 of the third contact hole H3. When the introduction depth is less than a depth of the third contact hole H3 (e.g., than the thickness of the insulation layer 150 or than the height t4 of the through electrode TV), an air gap AG may be created below the bottom electrode contact BEC' and thus an electrical open may be produced at the bottom electrode contact BEC'.

According to some example embodiments of the present inventive concepts, two layers may constitute the bottom electrode contact BEC connected to a memory element ME which will be discussed below. The first bottom electrode contact BEC1, or a lower portion of the bottom electrode contact BEC, may be formed to have the width W1 that is large along a thickness of the insulation layer 150. The second bottom electrode contact BEC2, or an upper portion of the bottom electrode contact BEC, may be formed to have a width W2 that is small enough to increase electrical characteristics of an interface between the memory element ME and the bottom electrode contact BEC. According to the present inventive concepts, regardless of the height t4 of the through electrode TV, it may be possible to connect the memory element ME and the bottom electrode contact BEC between the second lower conductive pattern 144 and the upper conductive pattern 160, and to reduce defects such as electrical open that occurs at the bottom electrode contact BEC.

Referring again to FIG. 14, an etching process may be performed to increase a width of the inner space (or the upper segment H2b of the second contact hole H2) that is formed when the top surface of the second bottom electrode contact BEC1 and the top surface of the second barrier layer BL2 are recessed from the top surface of the second insulation layer 154. An isotropic etching process may be performed to etch an inner wall 156 of the second insulation layer 154 exposed to the upper segment H2b of the second contact hole H2. Therefore, the upper segment H2b of the second contact hole H2 may have an increased width W3. The width W3 of the upper segment H2b of the second contact hole H2 may be less than the width W1 of the first bottom electrode contact BEC1.

Figure 16:
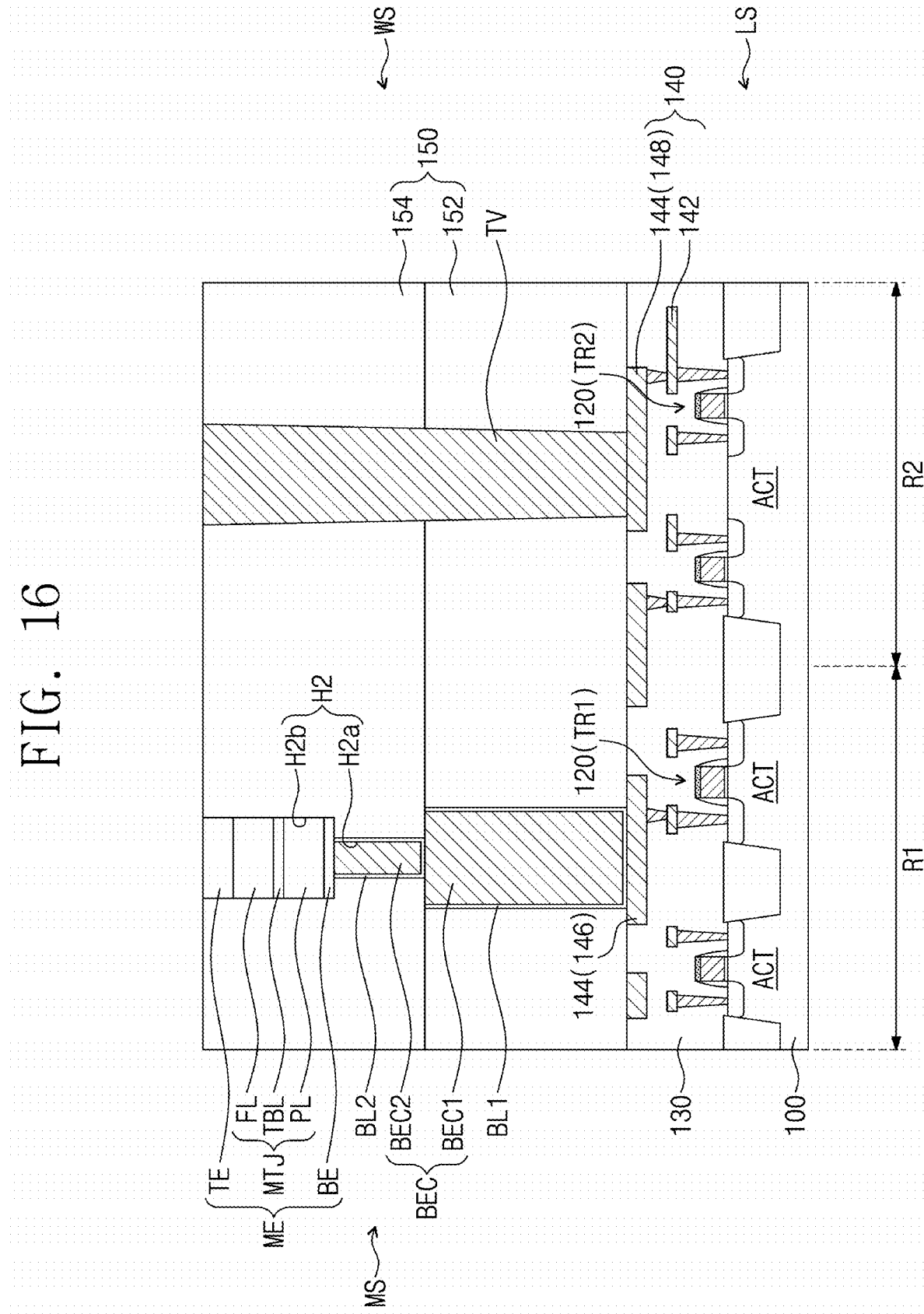

Referring to FIG. 16, a bottom electrode BE, a magnetic tunnel junction MTJ, and a top electrode TE may be sequentially provided in the upper segment H2b of the second contact hole H2, thereby forming a memory element ME. The bottom electrode BE may fill a lower portion of the upper segment H2b of the second contact hole H2. The bottom electrode BE may be formed on a bottom surface of the upper segment H2b of the second contact hole H2 and may be in contact with the second bottom electrode contact BEC2. A pinned layer PL, a tunnel barrier layer TBL, and a free layer FL may be sequentially formed on the bottom electrode BE. A chemical vapor deposition (CVD) process may be used to form the pinned layer PL, the tunnel barrier layer TBL, and the free layer FL. The top electrode TE may be formed on the free layer FL. The top electrode TE may fill a remaining portion of the upper segment H2b of the second contact hole H2. The memory element ME may completely fill the upper segment H2b of the second contact hole H2, and may have a top surface coplanar with that of the second insulation layer 154 and that of the through electrode TV.

Referring back to FIG. 3, an upper conductive pattern 160 may be formed on the second insulation layer 154. For example, a conductive material may be deposited on the second insulation layer 154, and then may be patterned to form a first upper conductive pattern 162 and a second upper conductive pattern 164 respectively on the first region R1 and the second region R2. The first upper conductive pattern 162 may be electrically connected to the memory element ME, and the second upper conductive pattern 164 may be electrically connected to the through electrode TV.

A third insulation layer 170 may be formed on the second insulation layer 154. For example, an insulation material may be coated to cover the upper conductive pattern 160, thereby forming the third insulation layer 170.

Accordingly, a semiconductor device may be fabricated which is discussed with reference to FIG. 3.

A semiconductor device according to some example embodiments of the present inventive concepts, it may be possible to decrease an interfacial area between a memory element and a second bottom electrode contact and to reduce power consumption for reset operation. The semiconductor device may thus improve in electrical characteristics.

Moreover, in a method of fabricating a semiconductor device according to some example embodiments of the present inventive concepts, regardless of heights of through electrodes, it may be possible to connect the memory element and the bottom electrode contact between the second lower conductive pattern and an upper conductive pattern, and to reduce defects such as electrical open that occurs at the bottom electrode contact.

Although the present invention has been described in connection with the some example embodiments of the present inventive concepts illustrated in the accompanying drawings, it will be understood by one of ordinary skill in the art that variations in form and detail may be made therein without departing from the spirit and essential feature of the present inventive concepts. The above disclosed embodiments should thus be considered illustrative and not restrictive.

What is claimed is:

1. A semiconductor device, comprising:
a substrate;
a first conductive pattern on the substrate;
a second conductive pattern on the substrate, the first conductive pattern and the second conductive pattern are laterally spaced apart from each other;
a first contact on the first conductive pattern;
a second contact on the first contact;
an upper barrier layer extending from between the first contact and the second contact to a lateral surface of the second contact;
a magnetic tunnel junction on the second contact, the first contact, the second contact and the magnetic tunnel junction are connected in series;
a through electrode on the second conductive pattern; and
upper conductive patterns connected with the magnetic tunnel junction and the through electrode.

2. The semiconductor device of claim 1, wherein a bottom surface of the first contact and a bottom surface of the through electrode are at the same level, the bottom surfaces of the first contact and the through electrode being in contact with the first conductive pattern and the second conductive pattern respectively.

3. The semiconductor device of claim 1, wherein a top surface of the magnetic tunnel junction and a top surface of the through electrode are at the same level, the top surfaces of the magnetic tunnel junction and the through electrode being in contact with the upper conductive patterns.

4. The semiconductor device of claim 1, wherein a first distance between the first conductive patterns and the upper conductive patterns and a second distance between the second conductive patterns and the upper conductive patterns are same.

5. The semiconductor device of claim 4, wherein the first distance and the second distance are 1,000 Å to 1,500 Å.

6. The semiconductor device of claim 1, wherein a width of the first contact is greater than a width of the second contact.

7. The semiconductor device of claim 6, wherein the width of the second contact is less than a width of the magnetic tunnel junction.

8. The semiconductor device of claim 1, further comprising:
an insulation layer between the lower conductive patterns and the upper conductive patterns, the insulation layer surrounding the contact, the magnetic tunnel junction, and the through electrode.

9. The semiconductor device of claim 8, wherein the insulation layer includes:
a first insulation layer that surrounds the first contact and a lower portion of the through electrode; and
a second insulation layer that surrounds the magnetic tunnel junction, the second contact, and an upper portion of the through electrode.

10. The semiconductor device of claim 1, wherein the contact further includes a bottom barrier layer that covers a bottom surface and a lateral surface of the first contact.

11. A semiconductor device, comprising:
a substrate including integrated circuits;
lower conductive patterns on the substrate;
upper conductive patterns on the lower conductive pattern;
a through electrode that connects first one of the lower conductive patterns to first one of the upper conductive patterns; and
a bottom contact, a top contact, and a magnetic tunnel junction are connected in series between second one of the lower conductive patterns to second one of the upper conductive patterns,
wherein a width of the bottom contact is greater than the width of the top contact, and
wherein a distance between a bottom surface of the bottom contact and a top surface of the magnetic tunnel junction and a distance between a bottom surface of the through electrode and a top surface of the through electrode are same.

12. The semiconductor device of claim 11, further comprising:
an insulation layer that
fills a space between the lower conductive pattern and the upper conductive pattern,
surrounds a lateral surface of the through electrode, and
surrounds a lateral surface of the bottom contact, a lateral surface of the top contact, and a lateral surface of the magnetic tunnel junction.

13. The semiconductor device of claim 12, wherein
the bottom contact, the top contact, and the magnetic tunnel junction define a contact hole, the contact hole penetrating the insulation layer and exposing the second one of the lower conductive patterns,
the through electrode defining a via hole, the via hole penetrating the insulation layer and exposing the first one of the lower conductive patterns, the via hole being spaced apart from the contact hole, and
a width of the via hole is greater than a width of the contact hole.

14. The semiconductor device of claim 11, wherein the integrated circuits are electrically connected to the substrate through a plug that vertically extends between the substrate and the lower conductive patterns.

15. The semiconductor device of claim 11, wherein a distance between the lower conductive patterns and the upper conductive patterns is 1,000 Å to 1,500 Å.

16. The semiconductor device of claim 11, wherein a width of the top contact is less than a width of the magnetic tunnel junction.

17. A semiconductor device, comprising:
a transistor on a substrate;
an interlayer insulation layer on the substrate, the interlayer insulation layer covering the transistor;
a lower conductive pattern on the interlayer insulation layer and connected to the transistor;
a first insulation layer on the lower conductive pattern;
a second insulation layer on the first insulation layer;
a magnetic tunnel structure that includes a first contact, a second contact, and a magnetic tunnel junction that are sequentially stacked on the lower conductive pattern, and penetrating the first and second insulation layers, an interface between the first insulation layer and the second insulation layer is at the same level as a level of an interface between the first contact and the second contact;
a through electrode penetrating the first and second insulation layers, the through electrode being spaced apart from the magnetic tunnel structure; and an upper conductive pattern on the second insulation layer, the upper conductive pattern being connected to the magnetic tunnel structure and the through electrode.

18. The semiconductor device of claim 17, wherein the magnetic tunnel structure being defined by a contact hole that penetrates the first and second insulation layers, the through electrode being defined by a via hole that penetrates the first and second insulation layers, and wherein the contact hole and the via hole expose the lower conductive pattern.

19. The semiconductor device of claim 18, wherein the contact hole includes:

a first contact hole that penetrates the first insulation layer, the first contact defining the first contact hole; and a second contact hole that penetrates the second insulation layer and is spatially connected to the first contact hole, the second contact and the magnetic tunnel junction defining the second contact hole, wherein a width of the first contact hole is greater than a width of the second contact hole.

20. The semiconductor device of claim 18, wherein a depth of each of the contact hole and the via hole is 1,000 Å to 1,500 Å.

* * * * *